United States Patent [19]

Morris

[11] Patent Number: 4,677,458

[45] Date of Patent: Jun. 30, 1987

[54] CERAMIC IC PACKAGE ATTACHMENT APPARATUS

[75] Inventor: James B. Morris, Bloomington, Minn.

[73] Assignee: Control Data Corporation, Minneapolis, Minn.

[21] Appl. No.: 548,599

[22] Filed: Nov. 4, 1983

[51] Int. Cl.[4] ........................ H01L 23/02; H05K 1/00
[52] U.S. Cl. ........................................ 357/74; 357/80; 439/71
[58] Field of Search ............... 357/74, 80; 339/17 CF, 339/17 L, 17 LC, 64 M; 361/400, 405, 406, 408; 174/52 FP

[56] References Cited

U.S. PATENT DOCUMENTS

| | | | |
|---|---|---|---|
| 3,114,080 | 12/1963 | Koda et al. | 361/406 |
| 4,037,270 | 7/1977 | Ahmann et al. | 339/17 CF |
| 4,461,524 | 7/1984 | McGhee | 339/17 CF |
| 4,463,217 | 7/1984 | Orcutt | 174/52 FP |
| 4,506,938 | 3/1985 | Madden | 339/17 CF |
| 4,511,201 | 4/1985 | Baker et al. | 339/17 CF |
| 4,553,192 | 11/1985 | Babuka et al. | 361/400 |
| 4,555,152 | 11/1985 | Johnson et al. | 339/17 L |

Primary Examiner—John Lee
Assistant Examiner—Frank González
Attorney, Agent, or Firm—Edward L. Schwarz; Joseph A. Genovese

[57] ABSTRACT

An integrated circuit package includes a leadless ceramic chip carrier and four connectors mounted thereto. The chip carrier has a rectangular surface with a plurality of conductive pads at its periphery. Each connecter includes a set of elongate conductive arms attached to the contact pads and extended outward therefrom and parallel to one another. The outer ends of the arms in each connector are attached to a generally flat and dielectric member. The arms are folded back upon themselves to position each member opposite the leadless chip carrier surface, with the outer ends of its associated arms aligned with the pads. So aligned, the arm ends are positioned for direct connection to selected contacts on a printed circuit board.

4 Claims, 9 Drawing Figures

CERAMIC IC PACKAGE ATTACHMENT APPARATUS

BACKGROUND OF THE INVENTION

Leadless chip carriers are rectangular packages for mounting integrated circuit chips with respect to printed circuit boards. Developed to improve upon the presently more common DIP (dual in-line package), the leadless chip carrier replaces the outwardly protruding leads of the DIP with electrically conductive pads distributed about the periphery of the carrier's bottom surface. The leadless chip carrier thus offers the same number of electrical contacts using 70 percent less substrate surface area for a more effective use of circuit board surface area. The chip carrier pads also form shorter, more reliable conductive paths with significantly reduced inductance and capacitance, allowing the chip carrier to handle higher frequencies. The shorter paths of course reduce signal transmission time.

Leadless chip carriers can be constructed of a plastic, or of a ceramic such as aluminum oxide. A particuar advantage of the ceramic leadless chip carrier, both with respect to dual in-line packages and the plastic leadless chip carriers, is the ability to hermetically seal the IC chip within the carrier, thus to provide a chip usable in environments that require an absolute moisture seal.

Despit these advantages, the leadless ceramic chip carrier is not well adapted for mounting directly to a conventional circuit board in an environment of temperature extremes. This is due to the difference in thermal expansion coefficient between the ceramic carrier and printed circuit board, commonly referred to as thermal mismatch. When the printed circuit board and ceramic chip carriers mounted thereto experience temperature extremes, the different rates at which they expand or contract causes stress concentrations at the interfacing solder joints. Repeated expansions and contractions (cycles) cause cracking at the joints and increases electrical resistance to unacceptable levels.

There have been a number of attempts to solve the thermal mismatch problem. One approach involves special sockets into which the leadless chip carrier is inserted, the socket in turn being mounted to the printed circuit board. Aside from the added expense, these sockets eliminate most of the advantages of the carriers in size and shorter conductive paths. Alternatively, materials more thermally compatible with the ceramic chip carrier have been sought for printed circuit boards. The expense of this approach has been prohibitive. Yet another approach is to build up "pedestals" of conductive material such as copper on the circuit board contacts where the carrier pads are to be positioned. While this does increase flexibility, it weakens the connection and is labor intensive.

Another problem associated with leadless chip carriers is difficulty in their manufacturing and testing, since the carrier structure is not well adapted for automatic handling. Testing typically is performed using specially designed sockets which are expensive and increase handling since each carrier must be manually inserted, tested, then manually removed. Burn-in, if required, calls for special sockets in addition to the ordinary electrical testing sockets, multiplying the handling difficulties.

Therefore, it is an object of this invention to provide an inexpensive means for mounting a ceramic chip carrier to a conventional printed circuit board to withstand repeated thermal cycles over a wide temperature range. It is a further object of the invention to provide a simple, inexpensive integrated circuit package suitable for direct mounting to a conventional circuit board for use in a demanding environment involving temperature extremes. It is yet another object of this invention to provide a process for facilitating automatic manufacture and testing of integrated circuit packages including leadless ceramic chip carriers.

SUMMARY OF THE INVENTION

To achieve these and other objects, a connector is provided for joining a leadless chip carrier to a printed circuit board. The leadless chip carrier has a plurality of electrically conductive pads on the leadless chip carrier surface which faces the printed circuit board when the carrier is joined thereto. The printed circuit board has a plurality of conductive contacts aligned with the pads.

The connector includes a plurality of elongate, pliable and electrically conductive arms, and a normally planar dielectric member. The arms are fastened at first ends thereof to the member and extended therefrom substantially parallel to one another. Second ends of the arms are adapted for attachment to the chip carrier pads. With the second ends so attached, the arms support the member relative to the chip carrier. Further, when the member is moved to an opposed relation to the chip carrier surface, it simultaneously and substantially uniformly folds the arms back upon themselves to align the first ends with the pads and circuit board contacts, thereby positioning said first ends for attachment to said printed circuit board contacts.

Also in accordance with this invention there is provided an integrated circuit package including a leadless chip carrier having a plurality of elctrically conductive pads near the periphery of one of its surfaces. The package further includes at least one set of elongate, pliable, electrically conductive arms. Each arm is fastened at its proximal end portion to one of said pads and extends away from the chip carrier. Each arm is folded back to position its distal end portion s opposed relation to the chip carrier surface. One dielectric member is mounted to the arms of each set and held between the distal end portions and the chip carrier surface.

Yet another aspect of this invention is a process for assembling integrated circuit packages. A pliable strip is provided and includes an electrically conductive layer and a dielectric layer joined together. Material is selectively removed from the strip's conductive and dielectric layers to define a window in the strip, along with at least one set of electrically conductive arms. Each arm originates beyond the periphery of the window and extends into the window as a cantilever beam. Following the removal of material, a leadless chip carrier base is mounted to the strip. The electrically conductive pads of the base are each attached to one of the arms, specifically at the arm portion extended inside the window. With the base mounted to the strip, a die or chip is bonded to the base. Electrical connnections are completed between the die contacts and chip carrier pads.

A lid is then mounted to the leadless chip carrier base to enclose the chip within the chip carrier. The completed integrated circuit packages can then be removed from the strip for immediate use, or stored in reel form for subsequent use, testing or shipment.

The strip format facilitates automatic electrical testing of each package by means of probes contacting the conductive arms. The arms, being part of the strip, can be precisely positioned by the strip for contact with probes.

Preferably, slots are formed in the conductive and dielectric layers beyond the periphery of each window and substantially surrounding it. These slots cooperate with their associated window to form a plurality of dielectric members, each attached to a set of the arms. Once the IC package, including the arms and members, is removed from the strip, each member is movable with respect to the chip carrier to bend its associated set of arms. When placed in opposition to the carrier bottom surface, the members position the outward arm ends in opposed relation to the carrier pads, thus aligning them for connection to a printed circuit board.

When mounted to a printed circuit board with the connectors of the present invention, a ceramic leadless chip carrier occupies substantially the same area as would such carrier mounted directly by its pads. Yet the arms connecting the carrier pads to the circuit board contacts are deformable and accommodate any thermal mismatch, avoiding stress concentrations at the pads or contacts. Since the arm distal ends are aligned with the chip carrier pads, the package comprising the carrier and connectors matches the same printed circuit board contacts as the chip carrier directly through its conductive pads. A standard printed circuit board thus requires no modification to accept the package. The disclosed assembly process enables automatic handling and testing, significantly reducing the cost of IC package assembly.

IN THE DRAWINGS

These and other features and advantages are better understood through a reading of the detailed description in connection with the drawing, in which.

DESCRIPTION OF THE PREFERRED EMBODIMENT

Figure 1:
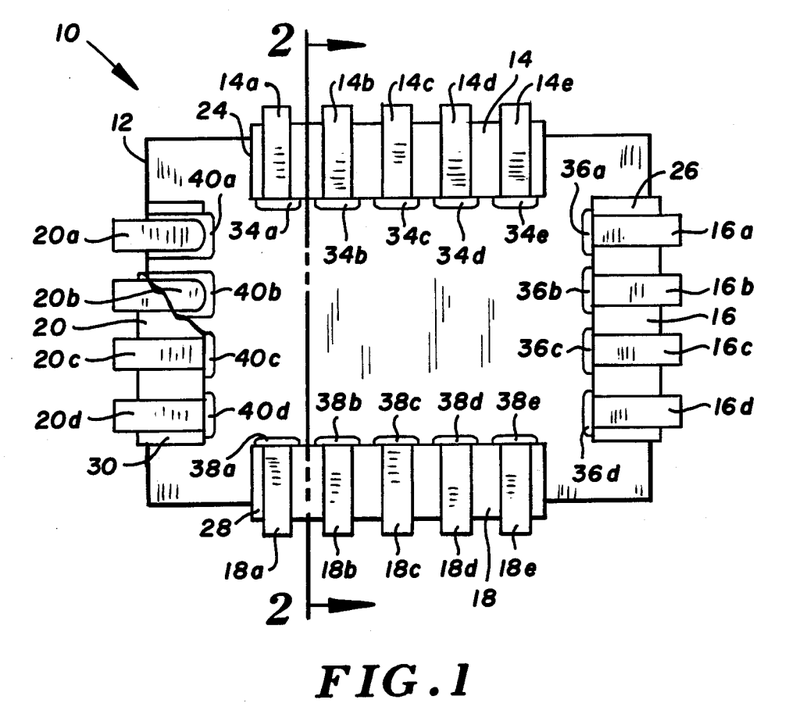
FIG. 1 is a bottom plan view of a ceramic integrated circuit package assembled in accordance with the present invention.
Figure 2:
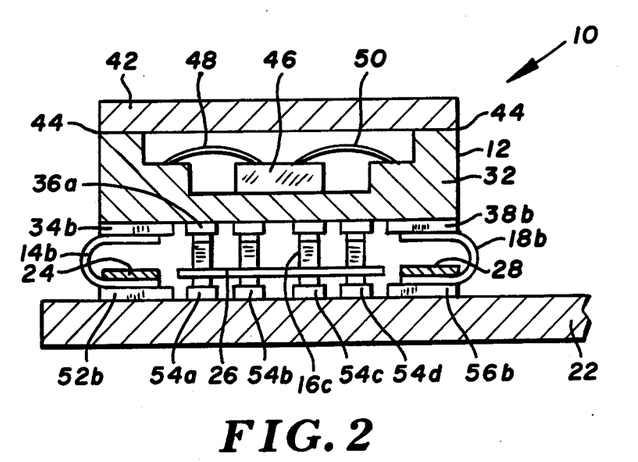
FIG. 2 is a cross-sectional view taken along the line 2—2 in FIG. 1.

Turning to the drawings, there is shown in FIGS. 1 and 2 an integrated circuit package 10. Package 10 includes a leadless chip carrier 12 and first, second, third and fourth connectors, 14, 16, 18 and 20 for connecting the package 10 to a printed circuit board 22. Each connector includes a plurality of electrically conductive arms mounted on and held together by a normally planar dielectic member or flap. For example, first connector 14 includes arms 14a, 14b, 14c, 14d and 14e mounted to a first member 24. Similarly, second connector 16 includes four conductive arms 16a, 16b, 16c and 16d mounted to a second member 26. Conductive arms 18a–18e and a third member 28 comprise third connector 18, while fourth connector 20 includes arms 20a–20d and a fourth member 30.

A base 32 of leadless chip carrier 12 includes a plurality of electrically conductive pads in spaced array about its perimeter and further arranged in groups corresponding to connectors 16–20, with each pad attached to one of the conductive arms. For example, each of pads 34a–34e is connected to one of arms 14a–14e. Similarily, pads 36a–36d are connected to arms 16a–16d, pads 38a–38e are connected to arms 18a–18e, and pads 40a–40d are connected to arms 20a–20d. The pad/arm connections are preferably made by gold-to-gold thermocompression bonding. An electroless plating of tin/gold solder rich in gold (i.e., 75% gold) is a satisfactory alternative.

Turning to FIG. 2, chip carrier 12 includes a lid 42 mounted to base 32. The base is constructed of a ceramic material, e.g., aluminum oxide (alumina). Lid 42 consists of Kovar (trademark of an FeNiCo alloy) plated with nickel and treated at its periphery with a gold/tin solder "preform". As the lid and base are bonded together, the preform acts along interface 44 to hermetically seal an integrated circuit chip 46 within the chamber defined by the base and lid. A plurality of wires, in this embodiment eighteen, connect each contact of chip 46 to an inner chip carrier contact and ultimately to one of the chip carrier pads. Two of these wires are shown at 48 and 50.

Conductive arms 14a–e, 16a–d, 18a–e and 20a–d form the mechanical and electrical connection between chip carrier 12 and printed circuit board 22. Circuit board 22 has 18 selected contacts corresponding to the pads of chip carrier 12, six of which are shown in FIG. 2 at 52b, 54a–d and 56b. Each printed circuit board contact is aligned with an associated one of the chip carrier pads in the sense that a vertical line running through a given pad also passes through its associated contact. Thus it is understood from FIG. 2 that leadless chip carrier 12 could be mounted directly to printed circuit board 22, with each pad soldered or otherwise connected to its associated printed circuit board contact.

Such direct mounting would be quite satisfactory under favorable conditions, e.g., where chip carrier 12 and printed circuit board 22 are constructed of materials having essentially the same coefficient of thermal expansion, or where the printed circuit board and carriers mounted thereon will not be subjected to significant fluctuations in temperature. By contrast, the more demanding environments encountered in space exploration, aviation and certain other fields involve frequent and extreme temperature fluctuations. Such environments often further require that the package be hermetic, and thus preferrably of ceramic material. The thermal mismatch between the ceramic chip carrier and the conventional plastic printed circuit board produce stress concentrations at the pad-connector junctions, cracking and eventually destroying the joints.

As seen in FIG. 2, each conductive arm is folded back upon itself or fomed into a "C" shape to bring the arm distal end into alignment with its proximal end and associated chip carrier pad, thus positioning the distal ends in lieu of the pads for connection to the selected circuit board contacts. The arms are constructed of an electrically conductive and deformable material, preferably copper. The resilient arms readily adjust to the different expansion and contraction rates of the printed circuit board plastic and chip carrier ceramic. Printed circuit board 22, with a higher thermal coefficient of expansion than ceramic chip carrier 12, undergoes more pronounced changes in length for a given change in temperature. Copper arms maintain electrical contact without damage to the pads, arms or circuit board contacts, even after numerous repeated temperature cycles over a range of 125 degrees centigrade to minus 55 degrees centigrade. Further, the printed circuit board contacts and chip carrier pads need not be precisely vertically aligned in order for the connectors to complete electrical contact between the chip carrier and circuit board.

The assembly of integrated circuit package 10 preferably occurs in two stages: a pre-assembly stage in which carrier base 32 is attached to a selectively patterned strip of flexible tape circuitry; and the mounting of chip 46 to the base and its sealing within chip carrier 12. Post assembly handling can include electrical testing, mechanical testing, and storage or shipment of completed packages still attached to the strip.

In preassembly, a strip 58 of flexible tape circuitry is treated to form selected, repeating patterns. The treatment necessary to form the patterns depends upon the construction of strip 58. For example, a two layered strip can be formed with liquid polyimide cast onto cold rolled copper and cured, or by the electroplating of copper to a polyimide sheet. Both the conductive and dielectric layers are then etched; the copper layer with acid, and the polyimide layer with a basic solution. These etching processes are well known and are not discussed in detail. Reference is made to U.S. Pat. No. 4,038,744 as an example of a copper etching process. Alternatively, strip 58 may be a laminate of copper and polyimide joined by an epoxy. In this three-layered strip, only the copper is etched and the polyimide layer is punched or cut to form the selected pattern.

Figure 3:
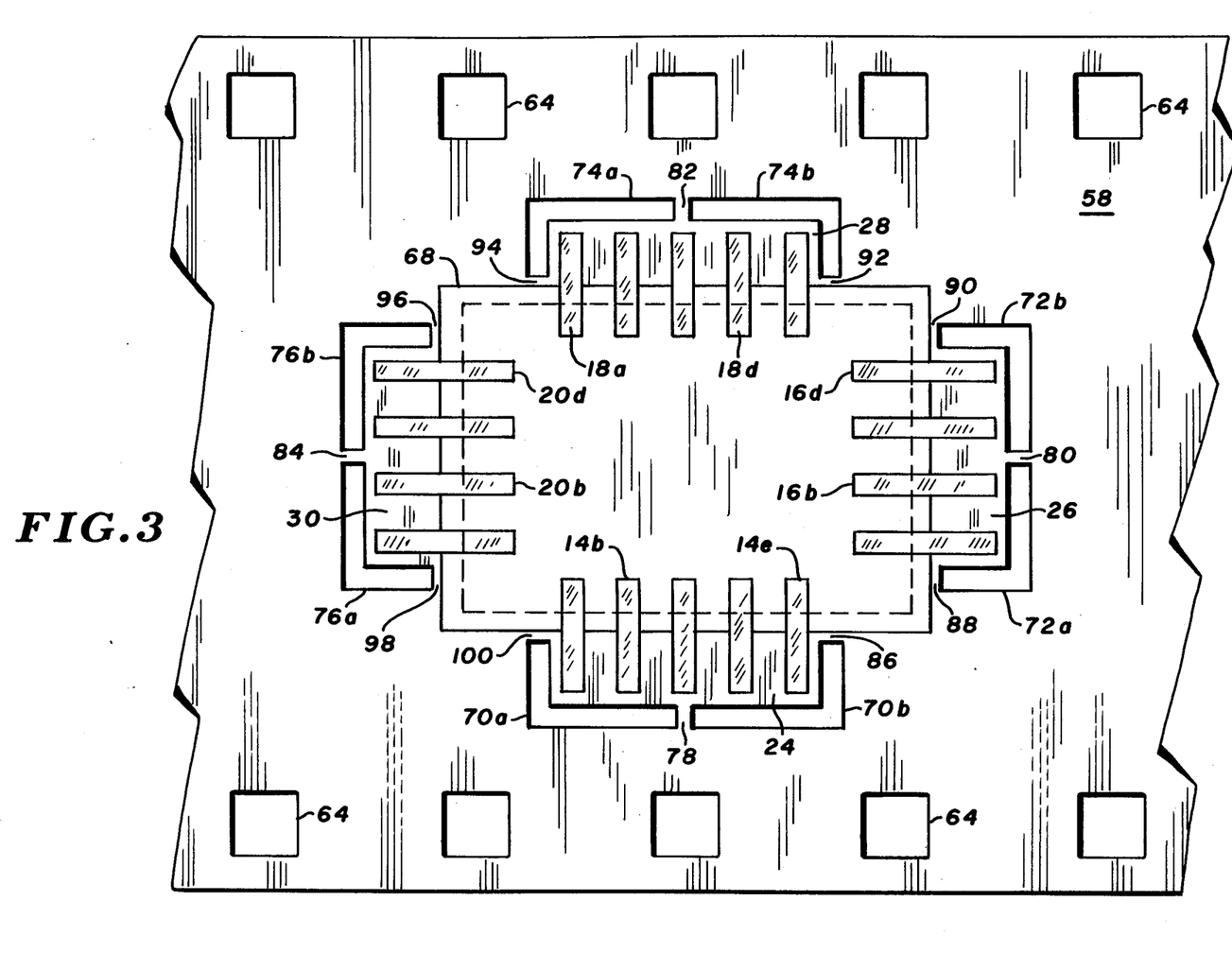
FIG. 3 is a top plan view showing part of a strip of flexible tape circuitry selectively etched for use in assembing IC packages in accordance with the present invention.

The result of treating strip 58, whether by etching alone or by punching or cutting as well, is a series of repeating patterns thereon, one of which is shown in FIG. 3. Formed along the strip side edges are equally spaced apart sprocket openings 64 adapted for driving engagement with sprocket drives used to move and control the position of strip 58. A central rectangular opening or "personality window" 68, preferably slightly larger in area than the bottom surface of base 32, is formed by removing all the dielectric layer and much of the conductive layer. Four pairs of generally L-shaped slots at 70a and b, 72a and b, 74a and b, and 76a and b, are fashioned in the strip by removal of the conductive and nonconductive layers from selected areas beyond the periphery of window 68.

Areas in the pattern where only the copper is removed include first, second, third and fourth members 24, 26, 28 and 30 around window 68. The members include outer tabs 78, 80, 82 and 84, each tab located between a pair of the slots. The members further include eight inner tabs 86, 88, 90, 92, 94, 96, 98 and 100. Finally, the pattern areas where only the polyimide is removed include the inward portions of the conductive arms of connectors 14, 16, 18 and 20 which extend into window 68 as cantilever beams. The inward or free ends of the conductive arms support leadless chip carrier 12 once it is attached to strip 58 in the position shown by the broken line in the Figure.

Figure 4:
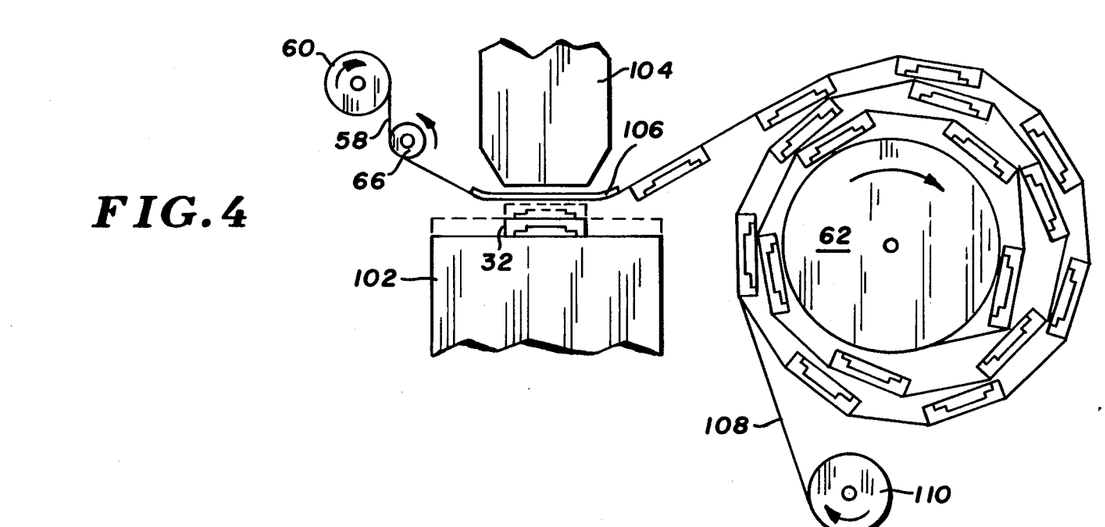
FIG. 4 is a diagramatic view of the attachment of chip carrier bases to the strip.

Attachment of base 32 to treated strip 58 is shown schematically in FIG. 4, where the strip is removed from a first reel 60 and wound onto a second reel 62, its position controlled by a first sprocket drive 66 having sprockets which drivingly engage sprocket openings 64 in the strip. Intermediate the two reels is a thermocompression bonding station including a vertically movable anvil 102, a thermode 104, and a tape guide 106 for controlling the lateral position of strip 58 and maintaining its planar configuration. Attachment begins with anvil 102 in its lower position (solid lines). Base 32 is centered on the anvil with its pads 34–40 facing upward. Strip 58, its polyimide layer facing upward, is moved by sprocket drive 66 to align one of the repeating patterns with base 32. Anvil 102 then is raised to its upper position (broken lines) to move each of the chip carrier pads 34–40 into connect with one of the arms 14–20 in strip 58. Pad to arm bonding occurs as anvil 102 and thermode 104 maintain the pads and arms against one another under pressure, while heat is supplied by the thermode. Following bonding, strip 58 is moved forward to align the next pattern with a subsequent chip carrier base while base 32 is carried on strip 58 toward second reel 62 and eventually wound onto that reel. If desired, spacer tape 108 from a spacer reel 110 can be wound on reel 62 between successive layers of strip 58.

Figure 5:
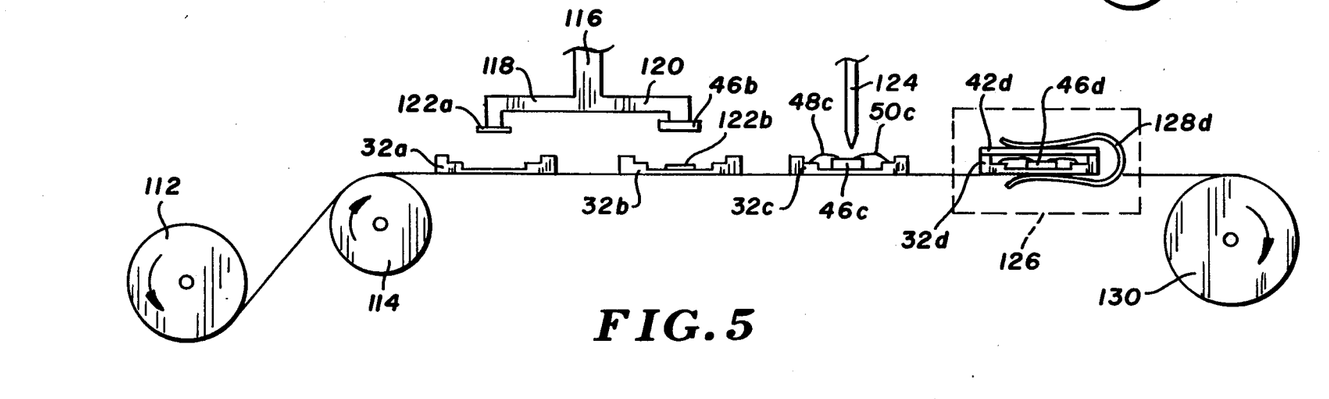
FIG. 5 is a diagramatic view of the assembly of IC packages.

FIG. 5 illustrates the assembly of package 10, including die bonding, wire bonding, and sealing. Removed from a third reel 112 and positioned-controlled by a second sprocket drive 114, strip 58 positions each chip carrier base 32 at successive assembly stages. Die attachment is accomplished in two such stages with a vacuum operated device 116 having first and second vacuum arms 118 and 120. First vacuum arm 118 is shown supporting a preform 112a above a ceramic chip carrier base 32a, while second vacuum arm 120 supports a chip or die 46b directly above a preform 122b on a base 32b. Preforms 122 are preferably a eutectic alloy containing gold. With bases 32a and 32b in the position shown, device 116 is lowered to deposit preform 122a on base 32a, simultaneously placing chip 46b on base 132b. While device 116 is retracted to pick up another preform and chip, second sprocket drive 114 moves each base 32 to the next station and the operations are repeated. Options to this preferred method include use of separate vacuum devices at the preform handling and chip handling stations, and manual handling of preforms and chips using tweezers or like instruments.

Following die bonding, wire bonding is accomplished using a single, movable bonding probe 124. Beginning at the same preselected contact for each package, bonding probe 24 traces a preprogrammed path whereby it connects each die contact of a chip 46c to an associated inner contact of base 32c. Each inner contact is electrically connected to one of chip carrier pads 34–40, whereby the wires effectively link each die contact to an associated carrier pad. While only wires 48c and 50c are illustrated, it is understood that in this emobdiment, 18 such wires are employed.

Upon completion of wire bonding, the integrated circuit chip is hermetically sealed within the package. Hermetic sealing requires a furnace 126 represented by the broken lines in FIG. 5 at a scale much smaller than its actual preferred size. Shown in furnace 126 is a base 32d containing a chip 46d and a lid 42d placed on the base and held against the base by a spring-loaded clip 128d. Lid 42d has a gold/tin solder preform at its periphery, which, when sufficiently heated in the furnace, reflows to hermetically seal lid 42d against base 32d.

While package assembly is shown in FIG. 5 as a succession of stages along one strip 58, multiple strips may be employed, varying in number from one assembly stage to another to account for differences of time required at each stage. After assembly, the packages, still supported by strip 58, are wound unto a fourth reel 130. If desired, spacer tape such as tape 108 (FIG. 4) can be wound unto reel 130 along with strip 58. The reel format is particularly well adapted for shipping or storing the assembled packages.

Alternatively, strip 58 is not wound unto fourth reel 130, but is used to guide the assembled integrated circuit packages through a series testing stations. A variety of tests are employed to identify defective chips or packages, including AC and DC testing, burn in and mechanical testing. Prior art testing methods include manually inserting completed packages into specially designed sockets. Not only are the sockets expensive, but the task of insertion and removal is time-consuming.

As perhaps best seen from FIG. 3, suspension of chip carriers in the tape or strip format facilitates electrical testing and permits automation of such testing. The broken line in FIG. 3 indicates the position of the chip carrier in the assembled integrated circuit package on strip 58. The conductive arms of connectors 14-20 extend away from the chip carrier, thus enabling test probes (not shown) to electrically communicate with the chip carrier without physically contacting the pads. This arrangement avoids the possibility of damage to the pad/arm junctions during testing, and further facilitates automatic testing, as a sprocket drive in cooperation with sprocket openings 64 can quickly and accurately position the arms beneath the testing probes. Following AC and DC testing, strip 58 is moved to a burn in stage where each package is subjected to current levels significantly higher than those planned in actual use. Like AC and DC testing, burn in is accomplished with probes positioned above strip 58, the sprocket drive aligning successive packages for testing.

Mechanical testing also is accomplished with the assembled packages attached to strip 58. Packages expected to experience extreme temperature flucuations can be carried by strip 58 into chambers in which they are subjected to repeated temperature cycles varying from, for example, minus 55 degrees centigrade to plus 125 degrees centigrade. Alternatively, reels of assembled packages may be manually placed in such chambers.

Figure 6:
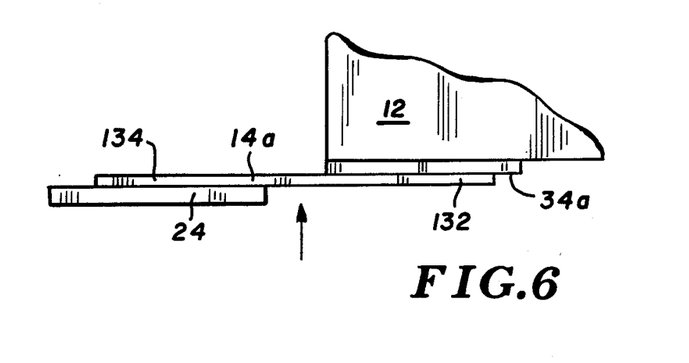
FIG. 6 is a side elevation of part of an IC package showing one of its electrically conductive arms.
Figure 7:
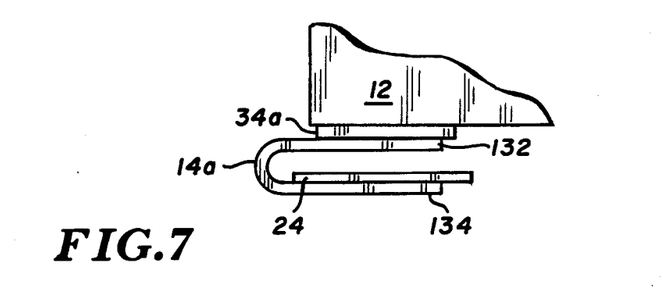
FIG. 7 is a view similar to that of FIG. 6, but with the arm folded back upon itself.

Before the mounting of package 10 on printed circuit board 22, connectors 14-20 are bent to align their conductive arms with pads 34-40. First, outer tabs 78-84 are broken to free their associated polyimide members 24-30 from the remainder of strip 58. Once free, each member is moved to a position beneath base 32, thus to bend its associated conductive arms and position their distal ends for attachment to selected contacts of printed circuit board 22. For example, in FIG. 6, conductive arm 14a and member 24 are shown immediately following the cutting of tab 78. A proximal end 132 of arm 14a is attached to pad 34a of leadless chip carrier 12, while a distal end 134 of the arm is attached to member 24. The arrow designates the point at which arm 14a, along with the remaining connector arms 14b-14e, are to be bent by moving member 24. FIG. 7 illustrates arm 14a after bending. Distal end 134, formerly extending outwardly of the chip carrier, is positioned directly beneath its assoicated pad 34a, in opposed relation to the chip carrier bottom surface, for direct attachment to printed circuit board 22. During and after bending, member 24 maintains conductive arms 14a-e in substantially the same plane and prevents their transverse movement with respect to one another.

The polyimide members facilitate alignment, first by insuring uniform bending since the distal end of each arm is connected to its associated member. Further, each member maintains its associated conductive arm distal ends in the same plane, thus to position all arms of a particular connector substantially the same distance from base 32. The conductive arms, being bound together by their associated member, are collectively more durable under automatic handling as compared to individual arms.

Figure 8:
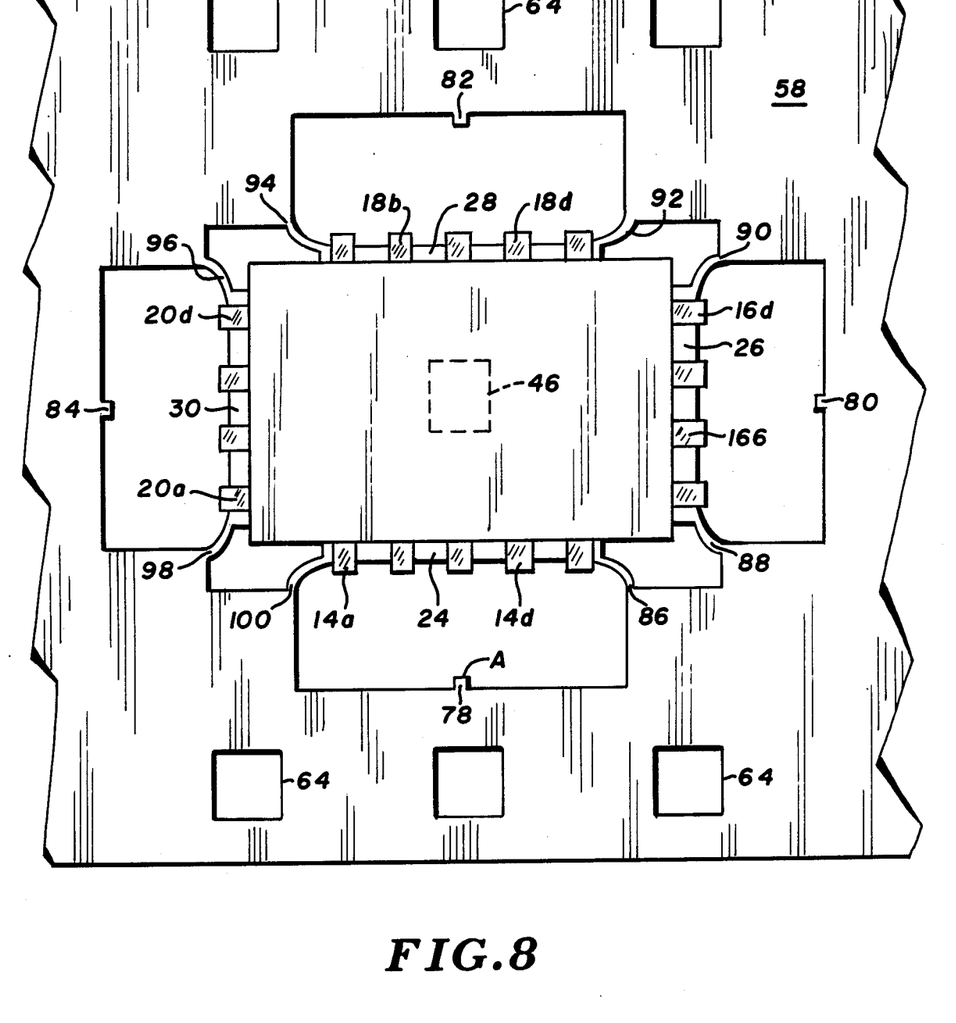
FIG. 8 is a view of the strip portion shown in FIG. 3 showing the IC package mounted to the strip, after folding of the arms but still suspended in the strip format.

FIG. 8 shows leadless chip carrier 12 following bending of the arms. The letter A indicates the point at which tab 78 was broken to free member 24 from the remainder of the flexible tape circuitry. The distal ends of the conductive arms are beneath leadless chip carrier 12 and are not visible in FIG. 8. Inner tabs 86-100 support chip carrier 12 on strip 58 to allow the selective positioning of leadless chip carrier 12 by controlling the location of the strip. A series of integrated circuit packages comprising a leadless chip carrier 12 and connectors 14-20 can be packaged on a take-up reel for shipment or storage. An intermediate layer of spacer tape, simultaneously fed to the take-up reel from a spacer reel, protects the integrated circuit packages from damage.

Figure 9:
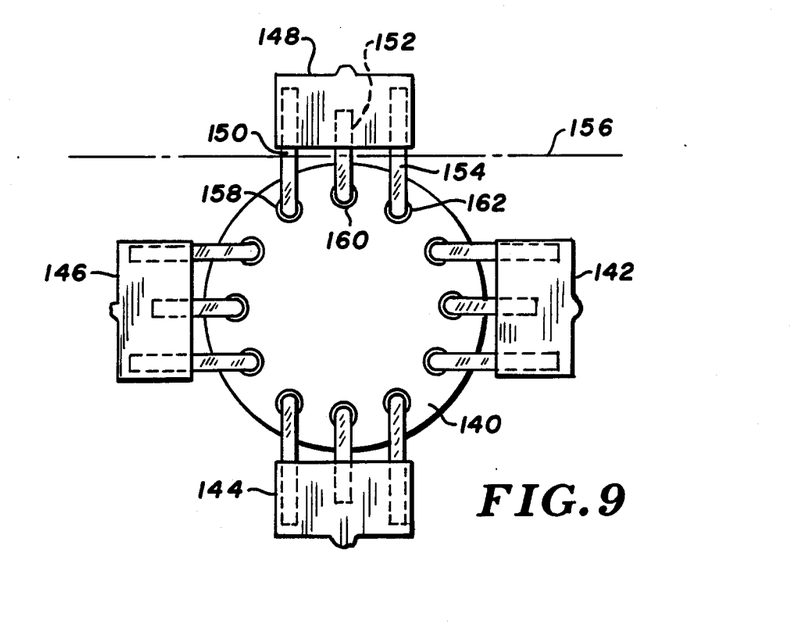
FIG. 9 is a top view of an alternative IC package embodiment in accordance with the invention.

FIG. 9 illustrates an integrated circuit package assembled in accordance with the present invention and having a leadless chip carrier 140 of circular construction. Each of dielectric members 142, 144, 146 and 148 is attached to three conductive arms of selected lengths such that movement of each member into opposed relation to chip carrier 140 positions the distal end of each conductive arm opposite its associated conductive pad. For example, movement of member 148 bends arms 150, 152 and 154 about an axis 156, thus to align the arm distal ends with pads 158, 160 and 162.

Integrated circuit packages assembled in accordance with the disclosed process can be attached directly to a printed circuit board and are particularly well adapted for envionments which subject the board and chip carriers to repeated cycles of hot and cold temperature extremes. The deformable arms linking the chip carrier pads to the circuit board contacts readily compensate for the effects of thermal mismatch. The connectors further can adjust to slight differences in spacing between rows of pads and rows of circuit board contacts. While the conductive arms in a given connector are individually deformable, each dielectric member guides its associated arms in a uniform bending that simultaneously positions all arms for connection. Each member further maintains its associated arms in alignment with one another, thereby facilitating their attachment to the printed circuit board and enhancing their strength.

Assembling the IC packages while they are attached to a strip of flexible tape circuitry substantially reduces the manufacturing cost. Packages are moved through a series of assembly and testing stations by moving the strip, thus to precisely position the packages and reduce the manual handling required. The arms formed in the strip provide conductive paths to the chip carrier pads so that test probes need not contact the chip carrier.

What is claimed is:

1. A connector for joining a leadless chip carrier to a printed circuit board, said chip carrier having a plurality of electrically conductive pads on the chip carrier surface facing said printed circuit board when said chip carrier is joined thereto, said printed circuit board having a plurality of electrically conductive circuit board contacts aligned with said pads, said connector including a plurality of elongate, pliable and electrically conductive arms and a normally planar dielectric member, said arms mounted with first ends thereof firmly attached to the surface of a side of said member and said arms extended therefrom and substantially parallel to one another, and the second ends of said arms adapted for attachment to said chip carrier pads; wherein, with said second ends so attached, said arms support said member relative to said chip carrier; and said member, when moved to an opposed relation to said chip carrier surface, simultaneously and substantially uniformly folds said arms back upon themselves to align said first ends with said pads and said circuit board contacts, said first ends in facing relationship with said circuit board contacts, thereby positioning said first ends for attachment to said contacts.

2. An integrated circuit package including a leadless chip carrier having a plurality of electrically conductive pads near the periphery of a first surface thereof; at least one set of pliable, electrically conductive elongate arms, each arm fastened at its proximal end portion to one of said pads, extending away from said leadless chip carrier, and further folded back to position its distal end portion in opposed relation to said first surface; and a dielectric member having a flat surface to which are firmly attached the distal end portions of the arms of each set, said dielectric member positioned between said distal end portions and said first surface.

3. The integrated circuit package of claim 2 wherein the arms in each set are parallel to one another.

4. The integrated circuit package of claim 2 wherein: said pads are aligned for connection to the contacts of a printed circuit board, and said distal end portions are aligned with said pads, thereby to align them with said contacts.

* * * * *